US011454690B2

(12) United States Patent
Wang et al.

(10) Patent No.: US 11,454,690 B2
(45) Date of Patent: *Sep. 27, 2022

(54) SYNERGIZED PULSING-IMAGING NETWORK (SPIN)

(71) Applicant: RENSSELAER POLYTECHNIC INSTITUTE, Troy, NY (US)

(72) Inventors: Ge Wang, Loudonville, NY (US); Qing Lyu, Troy, NY (US); Tao Xu, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 185 days.

This patent is subject to a terminal disclaimer.

(21) Appl. No.: 16/768,834

(22) PCT Filed: Dec. 7, 2018

(86) PCT No.: PCT/US2018/064446
§ 371 (c)(1),
(2) Date: Jun. 1, 2020

(87) PCT Pub. No.: WO2019/113428
PCT Pub. Date: Jun. 13, 2019

(65) Prior Publication Data
US 2021/0149005 A1 May 20, 2021

Related U.S. Application Data

(60) Provisional application No. 62/678,501, filed on May 31, 2018, provisional application No. 62/596,317, filed on Dec. 8, 2017.

(51) Int. Cl.
*G01R 33/54* (2006.01)
*G01R 33/56* (2006.01)
(Continued)

(52) U.S. Cl.
CPC ....... *G01R 33/543* (2013.01); *G01R 33/5608* (2013.01); *G01R 33/5615* (2013.01); *G01R 33/56545* (2013.01)

(58) Field of Classification Search
CPC .............. G01R 33/543; G01R 33/5608; G01R 33/5615; G01R 33/56545; G01R 33/56; G01R 33/58
(Continued)

(56) References Cited

U.S. PATENT DOCUMENTS 9,760,978 B1 * 9/2017 Lu ............................. G06T 5/50
2005/0017719 A1 * 1/2005 Heubes ............ G01R 33/56563
324/309

(Continued)

OTHER PUBLICATIONS

International Search Report and The Written Opinion of the International Searching Authority, International Application No. PCT/US2018/064446, dated Mar. 5, 2019.

*Primary Examiner* — Christopher P Mcandrew
(74) *Attorney, Agent, or Firm* — Murtha Cullina LLP; Anthony P. Gangemi

(57) ABSTRACT

A synergized pulsing-imaging network is described. A method of optimizing a magnetic resonance imaging (MRI) system includes optimizing, by a synergized pulsing-imaging network (SPIN) circuitry a pulse sequence based, at least in part, on a loss function associated with a reconstruction network. The method further includes optimizing, by the SPIN circuitry, the reconstruction network based, at least in part, on intermediate raw MRI data and based, at least in part, on a ground truth MRI image data. The intermediate raw MRI data is determined based, at least in part on the pulse sequence.

20 Claims, 7 Drawing Sheets

(51) Int. Cl.
*G01R 33/561* (2006.01)
*G01R 33/565* (2006.01)

(58) Field of Classification Search
USPC .......................................... 600/410
See application file for complete search history.

(56) References Cited

U.S. PATENT DOCUMENTS

| | | | | |
|---|---|---|---|---|
| 2009/0267604 | A1* | 10/2009 | Umeda | G01R 33/4828 |
| | | | | 324/309 |
| 2009/0279736 | A1* | 11/2009 | LaConte | A61B 3/113 |
| | | | | 382/103 |
| 2016/0157742 | A1* | 6/2016 | Huang | A61B 5/7235 |
| | | | | 600/409 |
| 2017/0356976 | A1* | 12/2017 | Shapiro | G06V 20/698 |

* cited by examiner

SYNERGIZED PULSING-IMAGING NETWORK (SPIN)

CROSS REFERENCE TO RELATED APPLICATION(S)

This application claims the benefit of U.S. Provisional Application No. 62/596,317, filed Dec. 8, 2017, and U.S. Provisional Application No. 62/678,501, filed May 31, 2018, which are both incorporated by reference as if disclosed herein in their entirety.

FIELD

The present disclosure relates to an imaging network, in particular to, a synergized pulsing-imaging network ("SPIN").

BACKGROUND

Machine learning, including deep learning, may be applied to computer vision and image analysis. Computer vision and image analysis primarily handle existing images and extract their features. Tomographic reconstruction, on the other hand, produces internal images from indirect data or features of underlying images. A combination of medical imaging and deep learning may facilitate not only image analysis but also image reconstruction. Deep learning techniques may be applied to tomographic reconstruction. For example, a common imaging model in MRI (Magnetic Resonance imaging) includes a Fourier formulation, e.g., Fourier transform.

In MRI, initially a homogenous background magnetic field is applied resulting in all the magnetization vectors (corresponding to spins, i.e., protons) associated with individual pixels/voxels, aligning along the direction of the background magnetic field. A pulse sequence is then applied to perturb these vectors and produce non-zero components on a plane perpendicular to the main field. These in-plane vectors generate alternating electromagnetic fields in nearby coils to produce so-called free induction decay (FID) signals. The recorded data are approximated as position-specific samples of the Fourier transform of the patient or animal to be topographically reconstructed. The samples are known as k-space data.

If the Fourier space is fully sampled by the pulse sequence, an MRI image can be directly reconstructed using the inverse Fourier transform. However, there are some challenges and limitations associated with Fourier-space-based approaches. For example, the detected MRI signal is relatively weak since a relatively small imbalance of up and down spins contributes to the net FID signal. Thus, the Fourier space may not be fully sampled. In another example, during data acquisition, the signal may experience a T2 defocusing, which is ignored in the current Fourier formulation. In another example, spinning protons that are actually moving may be assumed to be stationary or may be modeled in terms of low order moments. These challenges may result in errors/biases in image reconstruction based on the Fourier data and that increase when the data acquisition time is shortened (e.g., in certain cardiovascular or brain studies).

SUMMARY

In some embodiments, a method of optimizing a magnetic resonance imaging (MRI) system include optimizing, by a synergized pulsing-imaging network (SPIN) circuitry, a pulse sequence based, at least in part, on a loss function associated with a reconstruction network; and optimizing, by the SPIN circuitry, the reconstruction network based, at least in part, on intermediate raw MRI data and based, at least in part, on a ground truth MRI image data. The intermediate raw MRI data is determined based, at least in part, on the pulse sequence.

Some embodiments of the method further include determining, by the SPIN circuitry, an intermediate loss function based, at least in part, on the ground truth MRI image data and based, at least in part, on an optimized MRI image data output from the reconstruction network.

In some embodiments of the method, the optimizing the pulse sequence comprises iteratively adjusting at least one pulse sequence parameter. In some embodiments of the method, the at least one pulse sequence parameter is selected from the group comprising a flip angle ($\alpha$), a first magnetic field gradient ($G_x$), a second magnetic field gradient ($G_y$) and a proton density ($\rho$). In some embodiments of the method, the at least one pulse sequence parameter is adjusted based, at least in part, on a loss gradient and based, at least in part, on a learning rate.

In some embodiments of the method, the optimizing the pulse sequence and the optimizing the reconstruction network are iterative. In some embodiments of the method, the optimizing includes determining whether a current intermediate loss function is within a maximum loss increment of a prior loss function.

In some embodiments of the method, the reconstruction network is an artificial neural network (ANN) selected from the group including a deep neural network, a convolutional neural network (CNN), a residual encoder-decoder CNN (RED-CNN), a generative adversarial network (GAN) and/or a multilayer perceptron.

In some embodiments of the method, the pulse sequence is selected from the group including a spin-echo (SE) pulse sequence, a gradient-echo (GE) pulse sequence, an echo planar imaging (EPI) pulse sequence and an MR fingerprint (MRF) pulse sequence.

In some embodiments, a magnetic resonance imaging (MRI) system includes a synergized pulsing-imaging network (SPIN) circuitry configured to optimize a pulse sequence based, at least in part, on a loss function associated with a reconstruction network. The SPIN circuitry is further configured to optimize the reconstruction network based, at least in part, on intermediate raw MRI data and based, at least in part, on a ground truth MRI image data. The intermediate raw MRI data is determined based, at least in part, on the pulse sequence.

In some embodiments, the SPIN circuitry is configured to determine an intermediate loss function based, at least in part, on the ground truth MRI image data and based, at least in part, on an optimized MRI image data output from the reconstruction network.

In some embodiments of the system, the optimizing the pulse sequence comprises iteratively adjusting at least one pulse sequence parameter. In some embodiments of the system, the pulse sequence parameter is selected from the group including a flip angle ($\alpha$), a first magnetic field gradient ($G_x$), a second magnetic field gradient ($G_y$) and a proton density ($\rho$). In some embodiments of the system, the at least one pulse sequence parameter is adjusted based, at least in part, on a loss gradient and based, at least in part, on a learning rate.

In some embodiments of the system, the optimizing the pulse sequence and the optimizing the reconstruction network are iterative.

In some embodiments of the system, the optimizing includes determining whether a current intermediate loss function is within a maximum loss increment of a prior loss function.

In some embodiments of the system, the pulse sequence is selected from the group including a spin-echo (SE) pulse sequence, a gradient-echo (GE) pulse sequence, an echo planar imaging (EPI) pulse sequence and an MR fingerprint (MRF) pulse sequence.

In some embodiments of the system, wherein the reconstruction network is an artificial neural network (ANN) selected from the group comprising a deep neural network, a convolutional neural network (CNN), a residual encoder-decoder CNN (RED-CNN), a generative adversarial network (GAN) and/or a multilayer perceptron.

In some embodiments, a device includes means for performing any embodiment of the method.

In some embodiments, a computer readable storage device has stored thereon instructions that when executed by one or more processors result in the following operations including any embodiment of the method.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DETAILED DESCRIPTION

Figure 1:
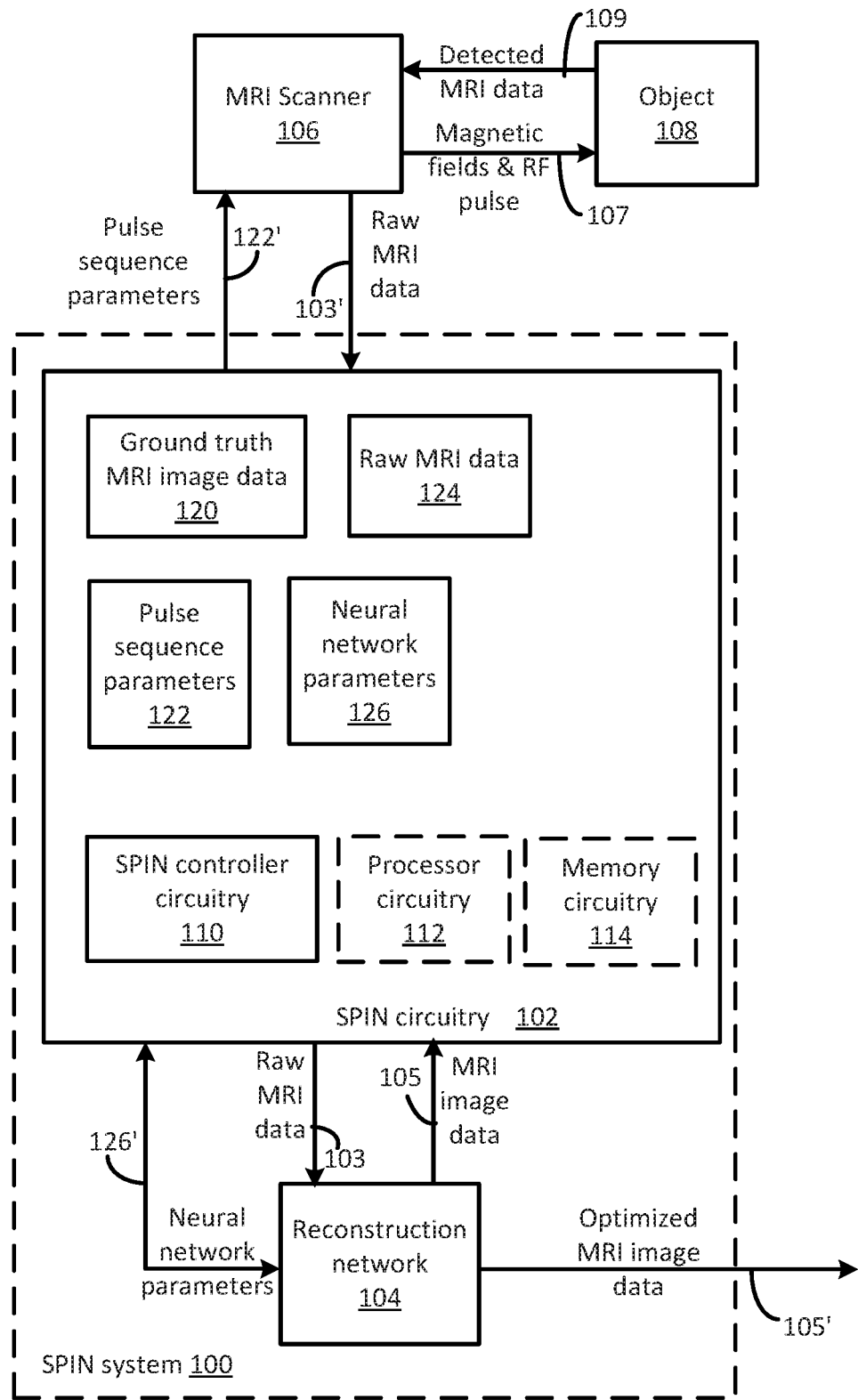
FIG. 1 illustrates a functional block diagram of a SPIN (synergized pulsing-imaging network) system consistent with serval embodiments of the present disclosure.

Generally, the present disclosure relates to synergizing a pulse sequence design and an associated imaging method into a deep neural network. The technique may be abbreviated as "SPIN" that corresponds to the Synergized Pulsing-Imaging Network. SPIN is configured to combine optimizing data acquisition in MRI with optimizing image reconstruction utilizing a reconstruction network, e.g., an artificial neural network (ANN). The data acquisition may be optimized by optimizing a pulse sequence based, at least in pa, on a loss function associated with a reconstruction network. The reconstruction network may be optimized based, at least in part, on intermediate raw MRI data and based, at least in part, on ground truth MRI image data. The intermediate raw MRI data may be determined based, at least in part, on the pulse sequence.

Thus, not only may image reconstruction be optimized, but also the data acquisition itself may be optimized. SPIN, consistent with the present disclosure, is configured to provide the optimizations without utilizing k-space data and/or the Fourier transform. Thus, with SPIN, the information content of raw MRI data can be maximized in a task-specific fashion and resultant MRI images can be optimally reconstructed in a data-driven manner.

An artificial neural network (ANN) is a network of elements (e.g., nodes) configured to receive input, change their internal state (activation) according to that input, and produce output depending on the input and activation. The network is formed by connecting the output of selected nodes to the input of other nodes to form a directed, weighted graph. The weights as well as the functions that compute the activation can be modified by learning (e.g., training).

A deep neural network is an ANN that has a plurality of layers between the input and output layers. A relationship between the input and the output may be linear or non-linear. A convolutional neural network (CNN) is a type of deep, feed-forward ANN, that includes one or more convolutional layers with fully connected layers on top. A multilayer perceptron (MLP) is a type of feed-forward ANN that includes at least three layers of nodes and each node, except for the input nodes, uses a nonlinear activation function. An MLP may be trained using back propagation, a supervised learning technique. The multiple layers and non-linear activation at an MLP distinguish it from a linear perceptron. CNNs are a type of deep ANN that use a variation of multilayer perceptions designed to use minimal preprocessing.

As used herein, the terms "neural network" and "artificial neural network" (ANN) correspond to artificial neural network, a deep neural network, a convolutional neural network (CNN), a residual encoder-decoder CNN (RED-CNN), a generative adversarial network (GAN) and/or a multilayer perceptron.

Deep learning is a type of machine learning technique that uses a cascade of a plurality of layers of nonlinear processing units for feature extraction and transformation. Each successive layer uses the output from the previous layer as input. Deep learning techniques learn in supervised (e.g., classification) and/or unsupervised (e.g., pattern analysis) manners. Deep learning algorithms learn multiple levels of representations that correspond to different levels of abstraction. In other words, deep-learning methods are representation-learning methods with multiple levels of representation, obtained by composing simple but non-linear modules that each transform the representation at one level into a representation at a higher, slightly more abstract level. With the composition of enough such transformations, very complex functions can be learned.

Generally, the present disclosure relates to a method and/or system configured to combine optimizing data acquisition in MRI with optimizing image reconstruction based, at least in part, on the acquired data and utilizing an artificial neural network. Thus, not only may image reconstruction be optimized with a trained ANN, the data acquisition itself may be optimized. Thus, with SPIN, the information content of raw MRI data can be maximized in a task-specific fashion and resultant MRI images can be optimally reconstructed in a data-driven manner.

SPIN, as a deep learning approach, is configured to target a data-driven mapping from an object to sampled MRI data and then to an MRI image of the object, without interpreting the data as Fourier coefficients and without performing the inverse Fourier transform. In an embodiment. SPIN may include two components: (1) data acquisition with a pulse sequence and (2) image reconstruction with a neural network. First, from actual objects or synthesized true images, raw MRI datasets can be generated according to a pulse sequence, which can be gradually refined in the training process after initialization. The data can be provided to a neural network with a sufficient expressing capability. The reconstruction neural network (i.e., ANN) is also trained. The loss function is driven by the difference between the truth and the output of the reconstruction neural network, and used to guide the optimization of both the pulse sequence and the reconstruction network. Such an optimization procedure can be conducted in various ways. For example, the neural network may be trained with data generated from a standard spin echo pulse sequence. The spin echo pulse sequence may then be optimized through a loss function. Thus, an alternating optimization process may be implemented to address both data acquisition and image reconstruction.

Thus, this disclosure relates to a synergized pulsing-imaging network (SPIN). A method of optimizing a magnetic resonance imaging (MRI) system includes optimizing, by a synergized pulsing-imaging network (SPIN) circuitry, a pulse sequence based, at least in part, on a loss function associated with a reconstruction network. The method further includes optimizing, by the SPIN circuitry, the reconstruction network based, at least in part, on intermediate raw MRI data and based, at least in part, on a ground truth MRI image data. The intermediate raw MRI data is determined based, at least in part, on the pulse sequence.

FIG. 1 illustrates a functional block diagram 100 of SPIN system consistent with several embodiments of the present disclosure. SPIN system 100 includes SPIN circuitry 102 and reconstruction network 104. SPIN system 100 may be coupled to MRI scanner 106. MRI scanner 106 may be configured to image object 108. SPIN system 100 is configured to integrate data acquisition and image reconstruction in a machine learning framework. In an embodiment, data acquisition may be optimized by adjusting one or more pulse sequence parameters. The pulse sequence parameters may be adjusted based, at least in part, on an output of a reconstruction network, e.g., reconstruction network 104. In one nonlimiting example, the reconstruction network may correspond to an artificial neutral network (ANN). The reconstruction network 104 may be configured to reconstruct an MRI image based, at least in part, on raw MRI data. The raw MRI data may be related to the pulse sequence parameters, as will be described in more detail below.

SPIN system 100 is configured to provide one or more pulse sequence parameters 122' to MRI scanner 106. MRI scanner 106 is configured to produce magnetic fields and RF pulses 107 and to subject object 108 to the magnetic fields and RF pulses. MR scanner 106 is further configured to detect corresponding detected MRI data 109. The detected MRI data 109 may include net magnetization vectors for each pixel/voxel and/or free induction decay (FID) signals.

The detected MRI data 109 may correspond to raw MRI data 103', as described herein. The detected MRI data 109 may be produced based, at least in part, on characteristics of the magnetic fields mid R pulse 107 and based, at least in part, on characteristics of object 108. The magnetic fields and RF pulse 107 may be generated based, at least in part, on pulse sequence parameters 122'.

Thus, SPIN system 100, e.g., SPIN circuitry 102, and including SPIN controller circuitry 110, may be configured to provide pulse sequence parameters to MRI scanner 106 and to received raw MRI data 103' from MRI scanner 106. MRI scanner 106 may then be configured to generate magnetic fields and/or RF pulses 107 based, at least in part, on the received pulse sequence parameters 122' MRI scanner 106 is further configured to detect detected MRI data 109 and to provide corresponding raw MRI data 103' to SPIN system 100 and SPIN circuitry 102 and/or SPIN controller circuitry 110.

Figure 2:
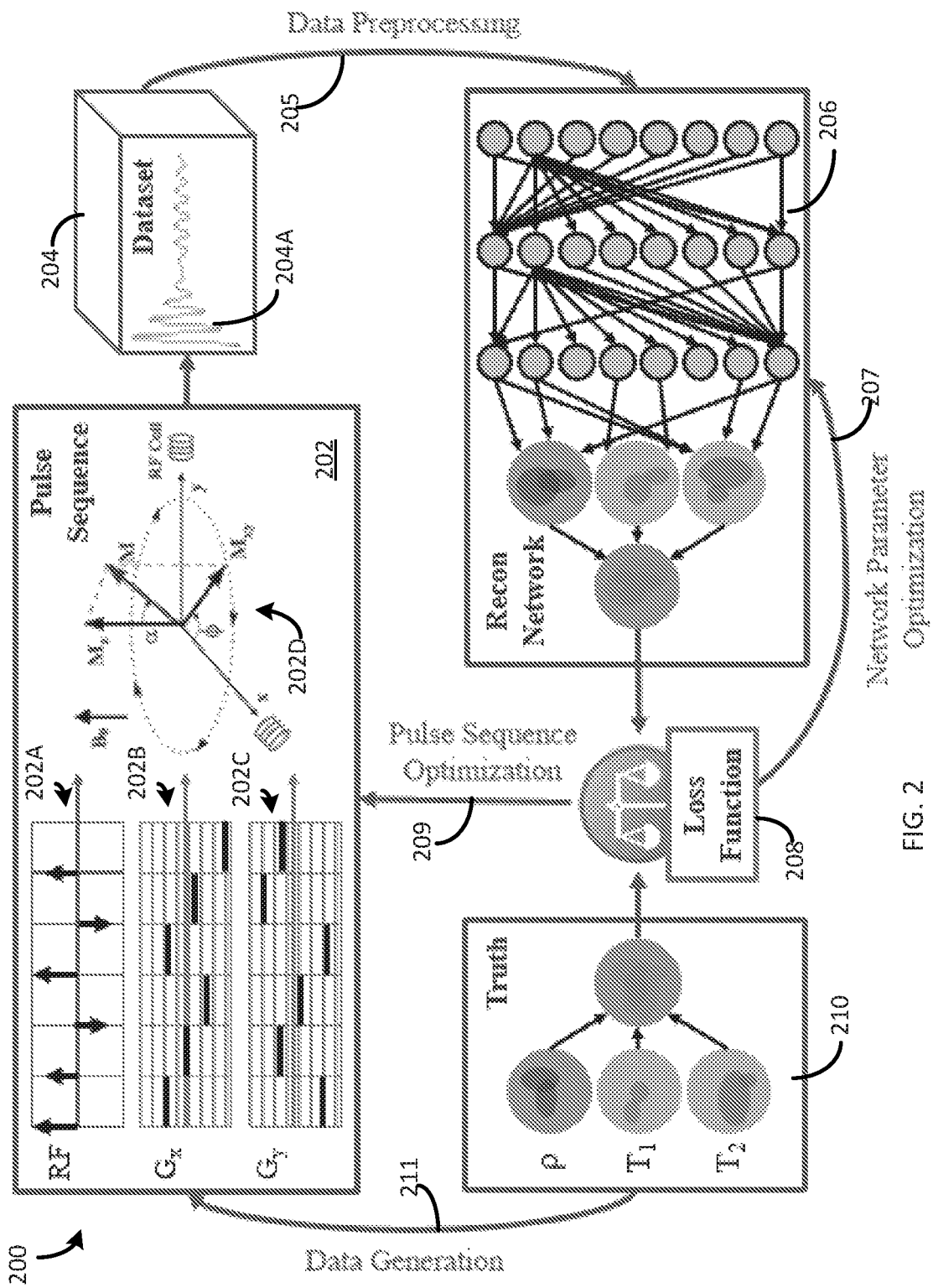
FIG. 2 illustrates a conceptual block diagram of an example SPIN system consistent with one embodiment of the present disclosure.

FIG. 2 illustrates a conceptual block diagram 200 of an example SPIN system consistent with one embodiment of the present disclosure. Example SPIN system 200 includes a pulse sequence block 202, a data set block 204, a reconstruction network block 206, a loss function block 208 and a ground truth block 210. The pulse sequence block 202 includes RF (radio frequency) pulse waveform 202A, a first applied gradient magnetization $G_x$ 202B and a second applied gradient magnetization $G_y$ 202C. The pulse sequence block 202 further includes a diagram 202D illustrating net magnetic field orientations. Pulse sequence block 202 is coupled to data set block 204. The data set block 204 includes a raw MRI data pulse 204A.

Reconstruction network block 206 is an ANN that includes a plurality of interconnected layers. Interconnect data processing 205 couples data set 204 to reconstruction network 206. Reconstruction network 206 is configured to provide a reconstructed MR image to loss function block 208. Reconstruction network block 206 is configured to receive network parameter optimization data 207 from loss function block 208. Loss function block 208 is further configured to receive the ground truth MRI image from ground truth block 210. Loss function block 208 may be configured to compare the ground truth MRI image to the reconstructed MRI image and to provide the pulse sequence optimization 209 to pulse sequence block 202 based on the result. Pulse sequence parameter values determined based, at least in part, on the ground truth image data 210 may be provided to pulse sequence block 202. Thus, conceptual block diagram 200 illustrates one example of a SPIN system, consistent with one embodiment of the present disclosure.

Tuning again to FIG. 1, SPIN circuitry 102 includes SPIN controller circuitry 110, processor circuitry 112 and memory circuitry 114. SPIN circuitry 102 may further include ground truth MRI image data 120, pulse sequence parameters 122, raw MRI data 124 and/or neural network parameters 126. SPIN controller circuitry 110 is configured to manage SPIN operations, as described herein.

Processor circuitry 112 may be configured to perform one or more operations of SPIN circuitry 102 and/or reconstruction network 104. Memory circuitry 114 may be configured to store information and/or data associated with SPIN training circuitry 102, reconstruction network 104 and/or SPIN controller circuitry 110. Memory circuitry 114 may be further configured to store ground truth MRI image data 120, pulse sequence parameters 122, raw MRI data 124 and/or neural network parameters 126.

SPIN circuitry 102 is configured to provide raw MRI data 103 to, and to receive MRI image data 105 from, reconstruction network 104. Initially, SPIN controller circuitry 110 may be configured to manage training of reconstruction network 104.

Initially, SPIN circuitry 102 may be configured to generate/acquire ground truth MRI image data that may then be utilized to optimize reconstruction network 104. The ground truth MRI image data 120 may then be stored in SPIN circuitry 102. SPIN circuitry 102 may be further configured to generate and/or acquire magnetic resonance parameters associated with ground truth MRI image data. The magnetic resonance parameters may include, but are not limited to, proton density (ρ), spin lattice relaxation time (T1) and/or spin-spin relaxation time (T2). The ground truth MRI image data may be generated based, at least in part, on a plurality of phantoms. In one nonlimiting example, the phantoms may be Shepp-Logan-type phantoms.

Turning again to FIG. 1, SPIN circuitry 102 may be further configured to set each of at least one pulse sequence parameter to a respective initial value. In one nonlimiting example, one or more of the pulse sequence parameters may beset to a random value. Pulse sequence parameters may include, but are not limited to, flip angle, α, a first magnetic field gradient, $G_x$, a second magnetic field gradient, $G_y$, and proton density, ρ. In some embodiments, pulse sequence parameters may further include pulse repetition time, TR and/or pulse echo time, TE. The pulse sequence parameters 122 may be stored in SPIN circuitry 102.

Figure 3:
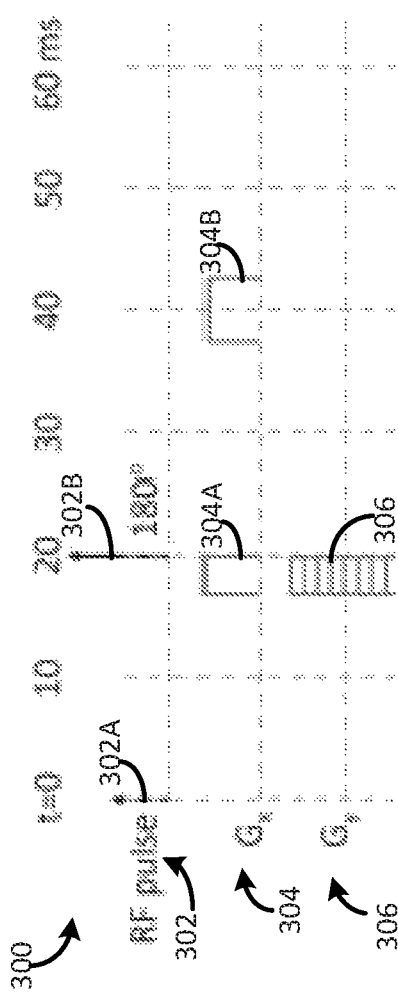
FIG. 3 is a plot illustrating one example discretized spin-echo pulse sequence.

FIG. 3 is a plot 300 illustrating one example discretized spin-echo pulse sequence. A SPIN system, e.g., SPIN system 100, may be utilized with one or more of a variety of pulse sequences. The pulse sequences may include, but are not limited to, spin-echo (SE), gradient-echo (GE), echo planar imaging (EPI), MR fingerprint (MRF) sequences, etc. Plot 300 corresponds to one nonlimiting example of a pulse sequence.

The plot 300 includes an RF pulse sequence 302 and magnetization gradient parameters, $G_x$ 304 and $G_y$ 306. The RF pulse sequence 302 includes a first RF pulse 302A at time t=0 and the second 180° RF pulse 302B at time t=20 ms (milliseconds). The repetition time (TR) and the echo time (TE) are 10 s (seconds) and 40 ms respectively. The first RF pulse 302A at time t=0 ms is configured to flip the magnetization vector by a selected angle. Generally, the flip angle, α, is between 0° and 180° and occurs as a result of the selected RF pulse. In one nonlimiting example, for a standard spin echo pulse sequence, the flip angle, α, is 90°. The second RF pulse 302B was produced at half of the echo time (t=20 ms). Generally, the resultant flip angle of a second RF pulse is 180. A first gradient magnetic field $G_x$ 304 was applied during time intervals 16.8-20 ms, 36.8-43.2 ms and a second gradient magnetic field $G_y$ 306 was applied during the time interval 16.8-20 ms.

Turning again to FIG. 1, SPIN circuitry 102, e.g., SPIN controller circuitry 110, may be configured to generate initial raw MRI data. The initial raw MRI data may be generated for a plurality of phantoms. e.g., A plurality of Shepp-Logan type phantoms. The initial raw MRI data may be stored, for example, in raw MRI data 124. The initial raw MRI data may be determined based, at least in part, on one or more of the pulse sequence parameters and phantom-related magnetic resonance data (e.g., ρ, T1, T2). Raw MRI data corresponds to net magnetization, and may be produced based, at least in part, on a type of pulse sequence and associated pulse sequence parameters.

As is known, the Bloch equation governs the MRI data generation. In one nonlimiting example, the raw MRI data may be generalized into an idealized two-dimensional (2) case for a spin echo pulse sequence over a spin-echo period of a limited length. The spin-echo period may be discretized into a number of same length intervals or time units. Initially, at time t=0, the magnetization vector M0 for every pixel was assumed to be well aligned with the direction of the background magnetic field. During the data acquisition, the pixel-specific magnetic vector as a function of time can be calculated in terms of Mx, My, and Mz step by step in a fine time resolution, e.g., 0.1 ms, according to the Bloch equation.

In a rotating reference frame, after a rapid flip of the magnetization vector, $M_{xy}(t)$ and $M_z(t)$ over the first time interval may be written as:

$$M_{xy}(t) = M_{xy}(0)e^{\frac{-t}{T_2}} = M_x(0)e^{\frac{-t}{T_2}} + iM_y(0)e^{\frac{-t}{T_2}} \quad (1)$$

$$M_z(t) = M_z(0)e^{\frac{-t}{T_1}} + M_0\left(1 - e^{\frac{-t}{T_1}}\right) \quad (2)$$

where $T_2$ should be $T_2^*$ if the pixel size is not sufficiently small. With the $G_x$ and $G_y$ effects, the pixel-specific $M_{xy}(t)$ vectors will rotate around the z-axis at pixel-specific frequencies $w=\gamma(G_x x+G_y y)$. That is, $$M_{xy}(t) = M_{xy}(0)e^{\frac{-t}{T_2}} e^{-i\gamma(G_x x + G_y y)} \quad (3)$$

and the resultant complex-valued detected, i.e., raw, MRI data (e.g., FID signal) may be recorded as real part, $s_x(t)$, and imaginary par, $s_y(t)$, respectively. Ignoring the scaling factor, $$s_x(t) = \text{Real}(\Sigma M_{xy}(t) \cdot \rho) \quad (4)$$

$$s_y(t) = \text{Imag}(\Sigma M_{xy}(t) \cdot \rho) \quad (5)$$

$s_x(t)$ and $s_y(t)$ may then be sampled at, e.g., 0.1 ms intervals, to generate data over the first time unit.

By the end of the first time interval, the pixel-specific magnetization vectors will generally not align with the z axis. Hence, at the beginning of the $2^{nd}$ time interval, the magnetization vector has a new initial state ($M'_x(0)$, $M'_y(0)$, $M'_z(0)$) different from that for the $1^{st}$ time interval. Specifically, $$M'_x(0) = M_x(0)e^{\frac{-\Delta}{T_2}} \cos(\gamma(xG_x + yG_y)\Delta) \quad (6)$$

$$M'_y(0) = M_y(0)e^{\frac{-\Delta}{T_2}} \sin(\gamma(xG_x + yG_y)\Delta) \quad (7)$$

$$M'_z(0) = M_z(0)e^{\frac{-\Delta}{T_1}} + M_0\left(1 - e^{\frac{-\Delta}{T_1}}\right) \quad (8)$$

where Δ is the time interval length. With the initial condition specified by Eqs. (6-8), the Bloch equations can be solved again over the 2nd time interval. Then, this procedure can be repeated for each of the remaining time intervals to generate raw MRI data.

In one nonlimiting example, the ground truth for a Phantom may correspond to a 64×64 matrix from the phantom T1, T2 and proton density values by calculating $$s = M_0(1 - e^{-TR/T_1})e^{-t/T_2} \cdot \rho \quad (10)$$

where t is the sampling time (between 36.8 ms and 43.2 ms over each spin echo period).

Turning again to FIG. 1, SPIN circuitry 102, e.g., SPIN controller circuitry 110, may be configured to provide the generated initial raw MRI data 103 to reconstruction network 104. Reconstruction network 104 may then be configured to generate initial MRI image data 105 based, at least in part, on the initial raw MRI data 103. SPIN circuitry 102 may then be configured to determine an initial loss function, $L_G$, that corresponds to a difference between the initial MRI image data and corresponding ground truth MRI image data. In one nonlimiting example, the loss function may be determined as a mean squared error.

SPIN circuitry 102, e.g., SPIN controller circuitry 110, may be configured to adjust a pulse sequence parameter. In one embodiment, SPIN circuitry 102 may be configured to adjust one pulse sequence parameter. In another embodiment, SPIN circuitry 102 may be configured to adjust a plurality of pulse sequence parameters. Each pulse sequence parameter may be adjusted by a respective pulse sequence parameter delta value, $\delta$.

SPIN circuitry 102, e.g., SPIN controller circuitry 110, may be configured to generate intermediate raw MRI data. Similar to the initial raw MRI data, intermediate raw MRI data may be generated for a plurality of phantoms. The intermediate raw MRI data may be stored, for example, in raw MRI data 124. The intermediate raw MRI data may be determined based, at least in part, on one or more of the adjusted pulse sequence parameters and phantom-related magnetic resonance data (e.g., $\rho$, T1, T2). The intermediate raw MRI data may be determined using the phantom data, the adjusted pulse sequence parameters and the Bloch equations, as described herein with respect to the initial raw MRI data.

SPIN circuitry 102, e.g., SPIN controller circuitry 110, may then be configured to provide the generated intermediate raw MRI data 103 to reconstruction network 104. Reconstruction network 104 may then be configured to generate optimized MRI image data 105 based, at least in part, on the intermediate raw MRI data 103. SPIN circuitry 102 may then be configured to determine an intermediate loss function, $L_i$, that corresponds to a difference between the optimized MRI image data and corresponding ground truth MRI image data.

SPIN circuitry 102 may be further configured to determine whether a current intermediate loss function is within a maximum loss increment of a prior loss function. The comparing is configured to indicate whether optimization of data acquisition and the reconstruction network is sufficient or at least one pulse sequence parameter should be adjusted. If optimization is sufficient, then optimization operations are complete. Optimized pulse sequence parameters may then be provided to MR scanner 106. Reconstruction network 104 may then be utilized to reconstruct optimized MRI image data based, at least in part, on raw MRI data received from MRI scanner 106. If optimization is not complete, then optimization operations may continue.

In one nonlimiting example, gradient descent may be used to determine whether optimization is sufficient. Specifically, each element in the first set of parameters is perturbed by a small quantity $\delta$ to estimate the partial derivative of the loss function with respect to that parameter. For example, the R pulse flip angle $\alpha_1$ for the 1st time interval can be changed to $\alpha'_1 = \alpha_1 + \delta$, and then the reconstruction network can be re-trained to obtain a new value of the loss function $L_1$. Then, the corresponding partial derivative can be estimated as:

$$\frac{\partial F}{\partial \alpha'_1} = \frac{L_1 - L_0}{\delta}$$

In the some way, all the other partial derivatives can be obtained to form the gradient vector $$\left(\frac{\partial F}{\partial \alpha'_1}, \frac{\partial F}{\partial G'_{x1}}, \frac{\partial F}{\partial G'_{y1}}, \ldots\right),$$

which can be used to improve the current pulse sequence. Along the steepest descent direction at an appropriate learning rate, for example, $\eta = 0.001$, the current pulse sequence can be updated $$\left(\alpha_1 + \eta \frac{\partial F}{\partial \alpha'_1}, G_{x1} \frac{\partial F}{\partial G'_{x1}}, \ldots\right).$$

By now, the first learning cycle is finished. Such a learning cycle may be repeated multiple times with respect to the first set of parameters (i.e., pulse sequence parameters) and the second set of parameters (i.e., neural network parameters associated with reconstruction network 104), and with respect to each of the ground truth objects/images. By doing so, the loss function will gradually be minimized until a stopping criterion is satisfied.

In one nonlimiting example, the loss function may be a combination of the mean squared error and the $L_1$-norm penalty, with a relaxation factor $\lambda = 0.0001$. This $L_1$-norm penalty was applied to the feature map of the final hidden layer. An RMSprop technique was used with mini-batches of size 100, Momentum 0.0 and decay 0.9. The learning rate was 0.0005 for the first 250 epochs and then divided by 1.01 every epoch. The neural network was implemented in TensorFlow on Nvidia GTX 1080 TI. The neural network was initiated using a normalized initialization technique. In this example, the training process took 30 epochs and about five hours.

Figure 4:
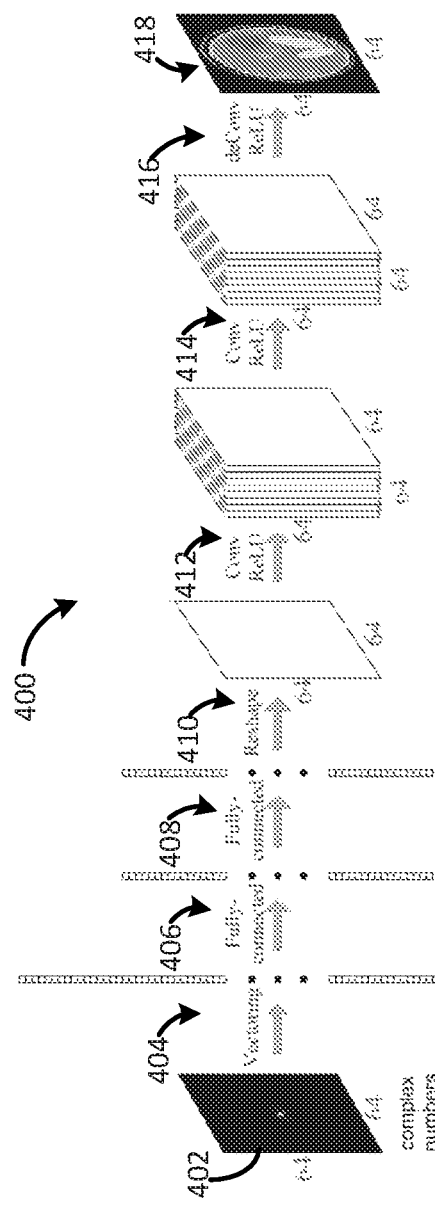
FIG. 4 illustrates a functional block diagram of one example reconstruction network according to one embodiment of the present disclosure.

FIG. 4 illustrates a functional block diagram 400 of one example reconstruction network according to one embodiment of the present disclosure. In this nonlimiting example, the reconstruction network 400 corresponds to a CNN. The CNN 400 includes two fully connected layers 406, 408, two convolutional layers 412, 414 and a deconvolutional layer 416. The input 402 corresponds to raw MRI data of a spin echo pulse sequence with 90° and 180° flip angles, sampled at 10,000 Hz. Prior to being provided to the neural network 400, the input raw MRI data 402 was first vectorized 404 from the original 64×64 complex valued matrix to a 4×64×2 real number vector (i.e., splitting each complex number into two real numbers representing real and imaginary parts respectively). The data was reshaped 410 between the second fully connected layer 408 and the first convolutional layer 412. The output 418 corresponds to an optimized MRI image.

Turning again to FIG. 1, SPIN circuitry 102 may be configured to adjust the pulse sequence parameter(s) to second value(s) if the current intermediate loss function is not within a maximum loss increment of a prior loss function. In other words, the pulse sequence parameters may be adjusted if a difference between the current intermediate loss function and the prior loss function is greater than the maximum loss increment. In one nonlimiting example, the pulse sequence parameter(s) may be adjusted based, at least in part, on the loss gradient and based, at least in pun, on the learning rate.

SPIN circuitry 102 and/or reconstruction network 104 may then be configured to repeat generating the intermediate raw MRI data, generating intermediate (e.g., optimized) MRI image data, comparing the intermediate MRI image data with the ground truth MRI image data and determining whether the difference between the current intermediate loss function and the prior loss function is greater than the maximum loss increment. SPIN circuitry 102 may then be configured to store the optimized pulse sequence parameter(s) if (when) the difference between the current intermediate loss function and the prior loss function is greater than the maximum loss increment.

Thus, in the SPIN technique, there are two sets of parameters to be trained. The first set of parameters is for the pulse sequence, involving angle-flip RF pulses and gradient signals $G_x$ and $G_y$, for each time interval. These parameters specify how raw MRI data are generated. The second set of parameters defines the reconstruction network so that it can reconstruct an optimized MRI image up to a relatively high quality.

In one nonlimiting example, at the beginning of the optimization process, all of the parameters may be randomly initialized. Then, MRI raw data can be obtained according to the Bloch equation. After that, the data are fed into the neural network, i.e., reconstruction network 104. Through a number of epochs, the neural network is trained to have the second set of parameters updated so that the initial value of the loss function $L_O$ is obtained. Then, the first set of parameters can be updated. This two-step process is a form of alternating iterative optimization, however, this disclosure is not limited in this regard.

The optimized pulse sequence parameters and trained, e.g., optimized, reconstruction network 104 may then be utilized to generate optimized MRI image data based, at least in part, on acquired raw MRI image data. For example, SPIN circuitry 102 may configure MRI scanner 106 based, at least in part, on the optimized pulse sequence parameters. In other words, SPIN circuitry 102 may be configured to provide the optimized pulse sequence parameters to MRI scanner 106. MRI scanner 106 may then be configured to provide corresponding magnetic fields and RF pulse sequences to object 108 into detect corresponding MRI data. SPIN circuitry 102 may be configured to acquire raw MRI data 103' corresponding to the detected MRI dated 109 from MRI scanner 106 and to provide the raw MRI dated 103 to reconstruction network 104. Reconstruction network 104 may then be configured to generate an optimized MRI image data based, at least in part, on the acquired raw MRI image data. Reconstruction network 104 may then be configured to output the optimized MRI image data from which an optimized MRI image nay be generated.

Figure 5A:
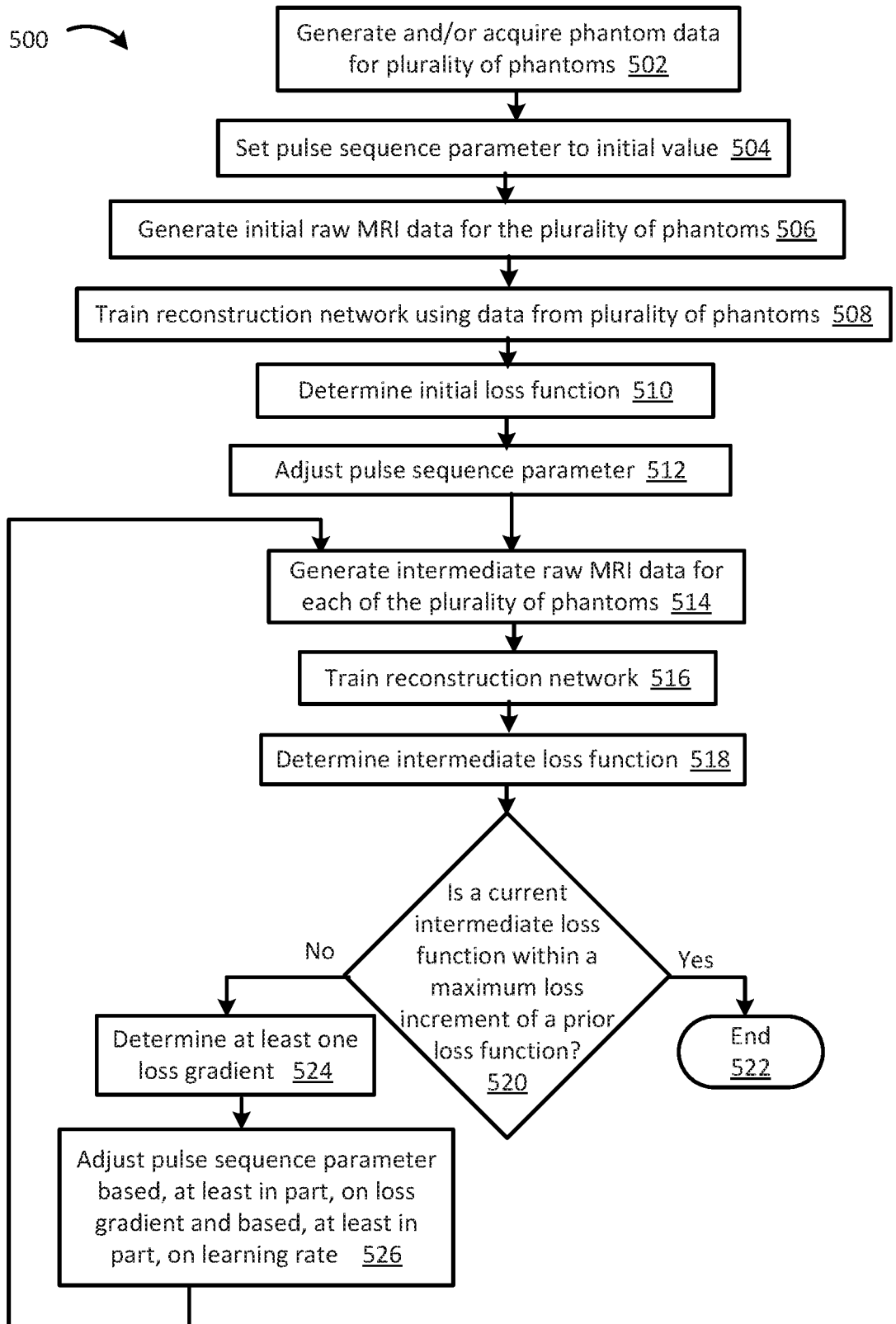
FIG. 5A is an example flowchart of SPIN optimizing operations consistent with several embodiments of the present disclosure.
Figure 5B:
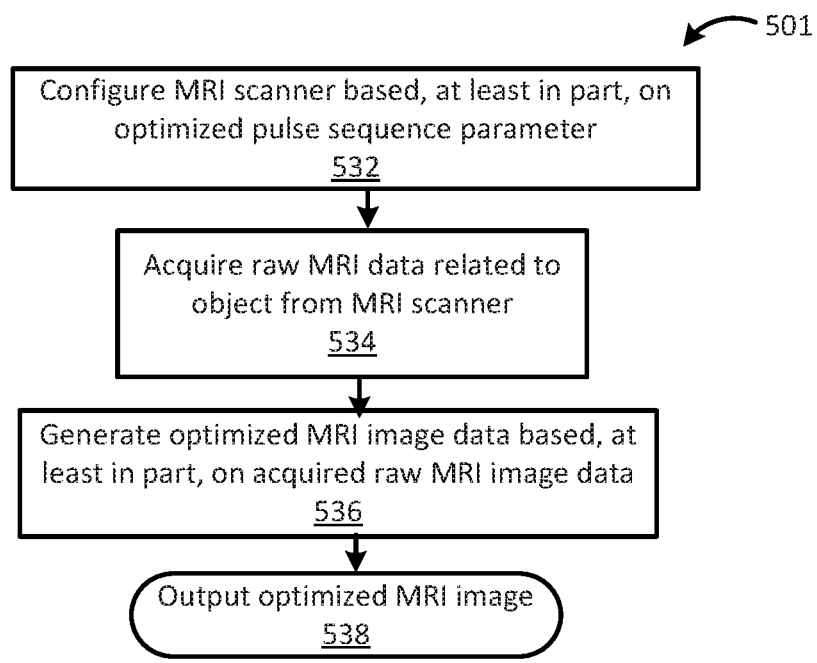
FIG. 5B is an example flowchart of imaging operations consistent with several embodiments of the present disclosure.

FIG. 5A is an example flowchart 500 of SPIN optimizing operations consistent with several embodiments of the present disclosure. In particular, flowchart 500 illustrates iteratively optimizing data acquisition and a reconstruction network. The operations of flowchart 500 may be performed by, for example, SPIN system 100 (e.g., SPIN circuitry 102, reconstruction network 104 and/or SPIN controller circuitry 110) of FIG. 1.

Operations of flowchart 500 may begin with generating and/or acquiring phantom data for a plurality of phantoms at operation 502. In one nonlimiting example, the phantoms may correspond to Shepp-Logan type phantoms. The phantom data may include magnetic resonance parameters ($\rho$, T1, T2) and ground truth MRI image data.

A pulse sequence parameter may be set to an initial value at operation 504. In an embodiment, one pulse sequence parameter may beset to an initial value. In another embodiment, a plurality of pulse sequence parameters may each be set to a respective initial value. In one nonlimiting example, the initial value may be a random value. Initial raw MRI data for the plurality of phantoms may be generated at operation 506. The initial raw MRI data may be generated based, at least in part, on at least one pulse sequence parameter, phantom data and Bloch equations, as described herein.

Operation 508 may include training a reconstruction network using data from a plurality of phantoms. For example, initial raw MRI data may be provided to the reconstruction network and an optimized MRI image data output may be compared with the corresponding ground truth MRI image data. An initial loss function may be determined at operation 510. The initial loss function may be determined based, at least in part, on the optimized MRI image data and based, at least in part, on the ground truth MRI image data. A pulse sequence parameter may be adjusted at operation 512. For example, the pulse sequence parameter may be adjusted by a pulse sequence parameter delta value.

Intermediate raw MRI data may be generated for each of the plurality of phantoms at operation 514. The intermediate raw MRI data may be generated based, at least in part, on phantom data, adjusted pulse sequence parameter(s) and the Bloch equations. The reconstruction network may be trained at operation 516. For example, the reconstruction network may be trained based, at least in part, on intermediate raw MRI data and corresponding ground truth MRI image data. An intermediate loss function may be determined at operation 518.

Whether a current intermediate loss function is within a maximum loss increment of a prior loss function may be determined at operation 520. If the current intermediate loss function is within the maximum loss increment of the prior loss function, then program flow may end at operation 522. If the current intermediate loss function is not within the maximum loss increment of the prior loss function, then at least one loss gradient may be determined at operation 524. In one nonlimiting example the loss gradient may be determined based, at east in part, on a current loss function value, a prior loss function value und a pulse sequence parameter delta value. Operation 526 includes adjusting a pulse sequence parameter based, at least in part, on the loss gradient and based, at least in part, on a learning rate. Program flow may then return to operation 514, generating intermediate raw MRI data.

FIG. 5II is an example flowchart 501 of imaging operations consistent with several embodiments of the present disclosure. In particular, flowchart 501 illustrates utilizing an optimized pulse sequence and trained reconstruction network for imaging an object. The operations of flowchart 500 may be performed by, for example, SPIN system 100 (e.g., SPIN circuitry 102, reconstruction network 104 and/or SPIN controller circuitry 110) of FIG. 1.

Operations of flowchart 501 may begin with configuring an MRI scanner based, at least in part, on an optimized pulse sequence parameter at operation 532. Raw MRI data related to an object may be acquired from the MR) scanner at operation 534. The raw MRI data may be related to the stored pulse sequence parameter(s). MRI image data may then be optimized based, at least in part, on acquired raw MRI image data at operation 536. The optimized MRI image may then be provided as output at operation 538.

Thus, a reconstruction network (e.g., an ANN) and data acquisition parameters (e.g., pulse sequence parameters) maybe optimized in the optimizations may be iterative. The optimizations may be performed without utilizing k-space data and/or a Fourier transform.

EXAMPLE

Figure 6:
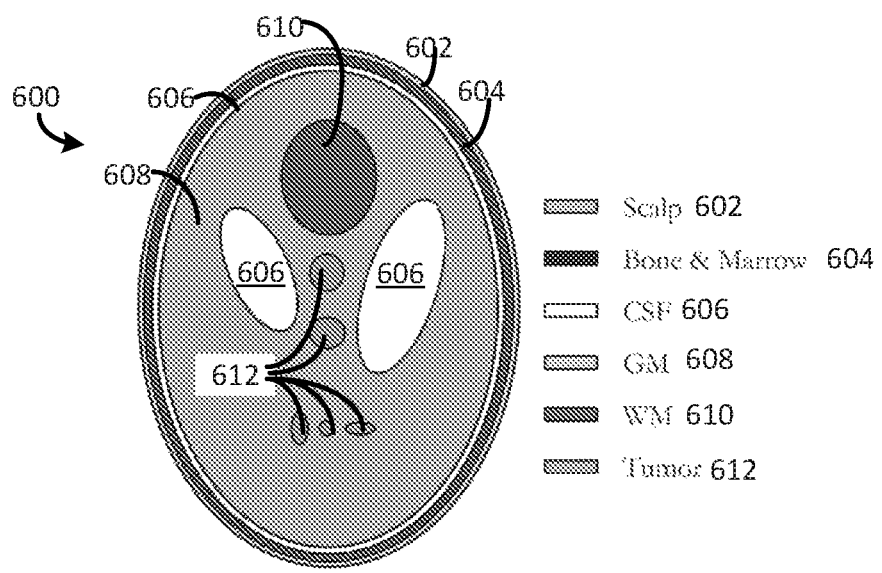
FIG. 6 is a sketch illustrating an example Shepp-Logan type phantom.

FIG. 6 is a sketch illustrating an example Shepp-Logan type phantom 600. The phantom 600 is configured to represent a variety of brain tissues. The phantom 600 includes a scalp 602 as an outer layer. A next layer corresponds to bone and marrow 604. The phantom 600 further includes cerebrospinal fluid (CSF) 606. The CSF 606 occupies an inner layer adjacent to the bone and marrow layer 604 as well as a plurality of ellipsoid regions. The phantom 600 further includes a region of gray matter (GM) 608 and a region of white matter (WM) 610. In this example, phantom 600 includes a plurality of tumor regions 612 distributed in the GM region 608.

Each phantom was discretized into 64×64 pixels, each of which has proton density, ρ, longitudinal relaxation time, T1, and transverse relaxation time T2 components. Collectively, these three components define biologically meaningful brain features: CSF, gray matter, white matter, and tumors. The width and height of phantom were both 64 mm. Each spin-echo pulse sequence lasted 10 s, with 100,000 time units (Each time unit was set to 0.1 ms). In principle, there could be an RF pulse at the beginning of each time unit and the resonance frequency determined by B0 with a strength B1. The flip angle could be randomly set between 0-180°. However, in this example, only the optimization for the 90-degree Rip angle was implemented.

In this example, an optimization of the first flip angle in the spin-echo pulse sequence was implemented. All of the parameters except the first flip angle in the first set of parameters were fixed. Also, the second set of parameters was optimized by training the reconstruction neural network (i.e., ANN) with MRI raw data generated from standard spin-echo pulse sequence as an initial reconstruction network. Then, the first flip angle was set to 30° and new raw MRI data was obtained. Ater that, MR images were reconstructed through the trained ANN, with the loss function defined as the mean squared error ($L_0$) of the reconstructed MRI image and the corresponding ground truth. The first flip angle was adjusted to 30° plus δ, and similarly a new mean squared error ($L_1$) obtained. According to the two mean squared errors, a new flip angle can be found using a gradient descent method. After a sufficient number of learning cycles, the flip angle was optimized to produce satisfactory MRI image reconstructions.

Table 1 includes parameters associated with the Shepp-Logan-type phantom illustrated in FIG. 6.

TABLE 1

| Ellipsoid | Center | | Half-Axis | | Angle | ρ | T1 | T2 | Tissue |
| | x | y | a | b | (degree) | | (ms) | (ms) | |
| --- | --- | --- | --- | --- | --- | --- | --- | --- | --- |
| 1 | 0 | 0 | 07.2 | 0.95 | 0 | 0.8 | 324 | 70 | Scalp |
| 2 | 0 | 0 | 0.69 | 0.92 | 0 | 0.12 | 533 | 50 | Bone & Marrow |
| 3 | 0 | −0.0184 | 0.66 | 0.87 | 0 | 0.98 | 4200 | 1990 | CSF |
| 4 | 0 | −0.0184 | 0.63 | 0.84 | 0 | 0.745 | 857 | 100 | GM |
| 5 | — | — | 0.35 | 0.13 | −72 | 0.98 | 4200 | 1990 | CSF |
| 6 | — | — | 0.28 | 0.09 | 72 | 0.98 | 4200 | 1990 | CSF |
| 7 | — | — | 0.18 | 0.22 | 0 | 0.617 | 583 | 80 | WM |
| 8 | — | — | 0.08 | 0.08 | 0 | 0.95 | 926 | 100 | Tumor |
| 9 | — | — | 0.08 | 0.05 | 0 | 0.95 | 920 | 100 | Tumor |
| 10 | — | — | 0.08 | 0.05 | −90 | 0.95 | 926 | 100 | Tumor |
| 11 | — | — | 0.08 | 0.08 | 0 | 0.95 | 926 | 100 | Tumor |
| 12 | — | — | 0.08 | 0.08 | 0 | 0.95 | 926 | 100 | Tumor |

Some ellipses' half-axis parameters were enlarged to show the corresponding components more clearly. Each phantom may be viewed an idealized brain organoid with ρ, T1 and T2 components in registered three 64-64 matrices. When designing the phantoms, positions of the 8 tissue components (one gray matter, two CSF regions, and five tumors) were randomly positioned in the central region, and there was no overlap between any two of these components. In total, 50,000 phantoms were generated to form the training dataset. An additional 1,000 phantoms were created for testing, focusing on the flip angle optimization.

Figure 7:
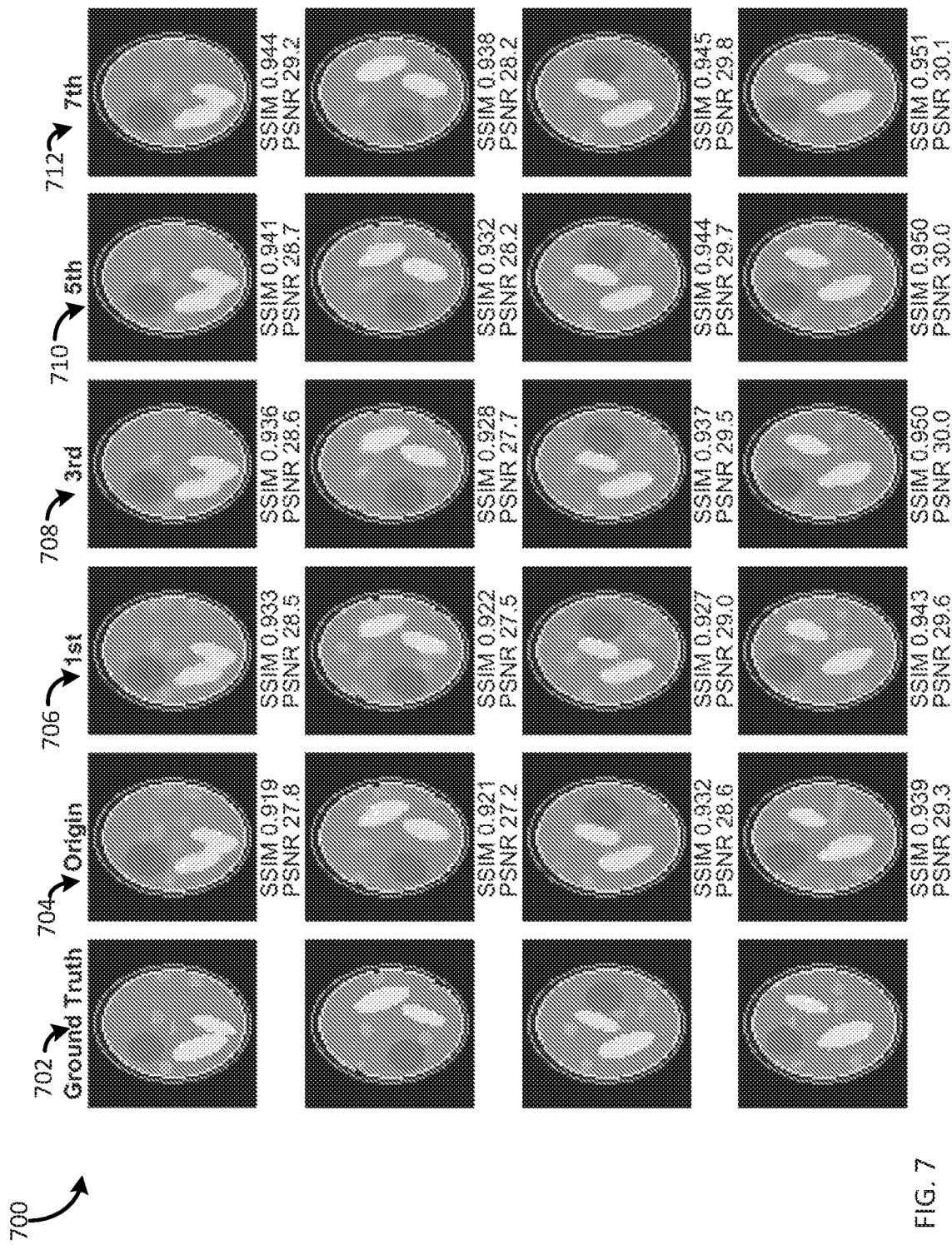
FIG. 7 illustrates MRI images of the Shepp-Logan type phantom of FIG. 6 reconstructed after one, three, five and seven SPIN system iterations.

FIG. 7 illustrates MRI images 700 of the Shepp-Logan type phantom of FIG. 6 reconstructed after one, three, five and seven SPIN system iterations. The MRI images 700 include ground truth images 702 and initial ("origin") reconstructed MRI images 704. The MRI images 700 further include reconstructed MRI images after one iteration 706, three iterations 708, live iterations 710 and seven iterations 712. The MRI images 700 further include SSIM (structural similarity index) and PSNR (peak signal-to-noise ratio) values for each image and iteration.

Using the SPIN technique, as described herein, that uses the trained convolutional neural network to reconstruct MRI images, Gibbs artifacts and noises were greatly suppressed in the reconstructed images as shown in FIG. 7. This illustrates the power of the neural network in noise reduction and artifact correction.

Figure 8:
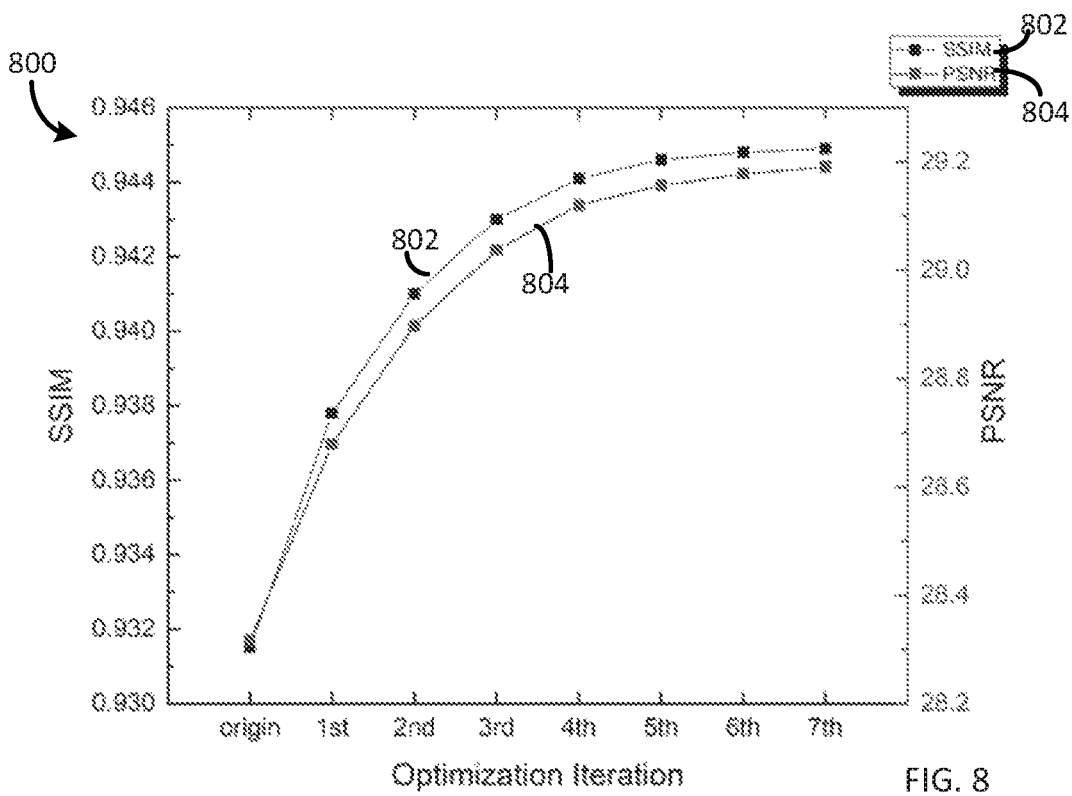
FIG. 8 is a plot illustrating average the structural similarity index (SSIM) and the peak signal-to-noise ratio (PSNR) values of 1,000 reconstructed MRI images during an example flip angler optimization process.

FIG. 8 is a plot 800 illustrating average the structural similarity index (SSIM) 802 and the peak signal-to-noise ratio (PSNR) 804 values of 1,000 reconstructed MRI images during an example flip angle optimization process. In the plot 800, the horizontal axis corresponds to optimization iteration in the vertical axis corresponds to SSIM and/or PSNR. It may be appreciated that SSIM and PSNR both increased as the number of optimization iterations increased up to about the seventh iteration. The rate of change of the SSIM and PSNR decreased as the number of iterations increased.

Quantitatively, with the increasing number of optimization iterations, the structural similarity index (SSIM) and the peak signal-to-noise ratio (PSNR) became gradually improved, as shown in FIG. 8. Before the flip angle optimization, the average SSIM of the 1,000 reconstructed MRI image and the average PSNR were 0.932 and 28.3 respectively. After the first 7 iterations, there measures were refined to 0.945 and 29.2 respectively.

Figure 9:
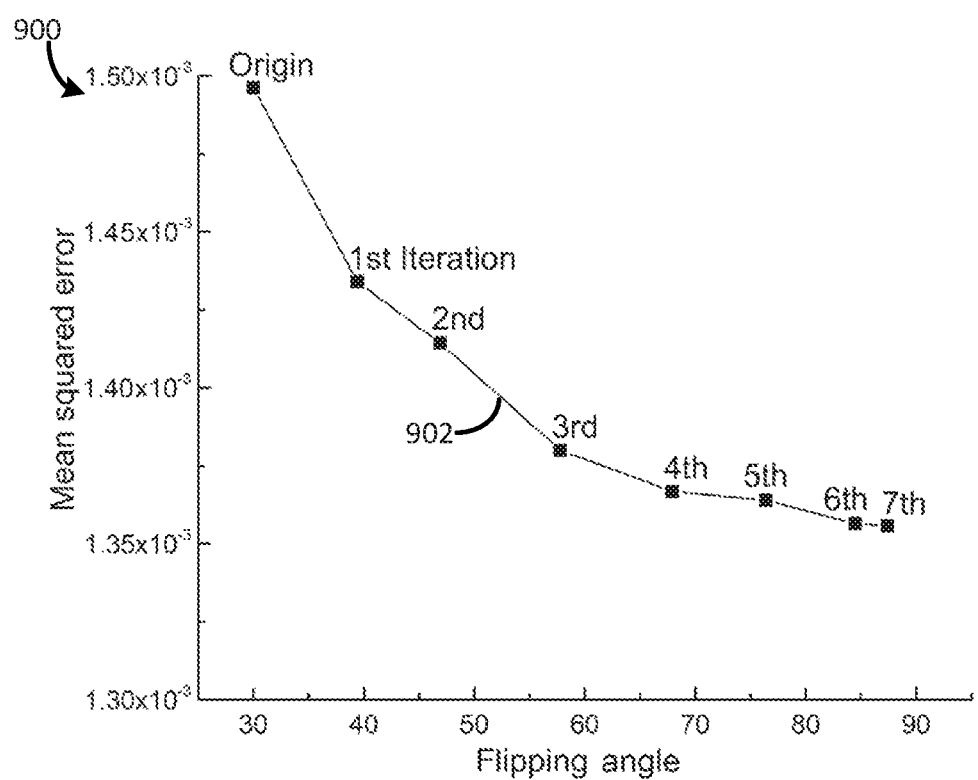
FIG. 9 is a plot illustrating mean squared errors of the 1,000 reconstructed MRI images of FIG. 8 after seven SPIN system iterations.

FIG. 9 is a plot 900 illustrating mean squared errors 902 of the 1,000 reconstructed MRI images of FIG. 8 after seven SPIN system iterations. In the plot 900, the horizontal axis corresponds to flip angle (a, and the vertical axis corresponds to mean squared error. It may be appreciated that the mean squared error decreased over the range of flipping angles.

FIG. 9 shows the variation of the mean squared error between the reconstructed images and their corresponding phantom ground truth, which implies that through iterations the mean squared error was greatly decreased. The flip angle was optimized to become close to 90° that is the optimal flip angle for the spin-echo pulse. Quantitatively, the value of the mean squared error was reduced front 0.001496 associated with the randomly-selected flip angle 30° before the optimization to 0.001362 associated with the optimized flip angle $7.9° after the first seven iterations.

Thus, a SPIN system, consistent with the present disclosure, is configured to design and optimize a pulse sequence in a machine learning framework. As the magnetization vectors are steered around or a maximized information content, the resultant data can be recorded, to a good degree, similar to randomized incoherent samples collected via compressed sensing. In the SPIN fashion, the k-pace is naturally bypassed, avoiding any approximations for the traditional MRI formulation rooted in the k-space.

SPIN is an intelligently streamlined MRI workflow front fundamental physics to first-hand information to optimized reconstruction regularized by big data. This is an example of the application of the systematic approach to MRI for precision medical imaging. In principle, the SPIN outcomes should be superior to that from a plain combination of a separately-performed pulse sequence design and an independently-optimized image reconstruction.

While SPIN has been described herein relative to MRI, it is contemplated that the idea can be extended to other imaging modalities and their combinations; such as ultrasound imaging and simultaneous emission-transmission tomography aided by polarized radiotracers.

A SPIN technique may be configured to synergize MRI data acquisition and image reconstruction in a unified machine learning framework.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may include, for example, singly or in any combination, hard-wired circuitry, programmable circuitry such as computer processors including one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a field-programmable gate array (FPGA), a programmable logic device (PLD), a complex programmable logic device (CPLD), a system on-chip (SoC), etc.

Processor circuitry 112 may include, but is not limited to, a single core processing unit, a multicore processor, a graphics processing unit, a microcontroller, an application-specific integrated circuit (ASIC), a field programmable gate array (FPGA), a programmable logic device (PLD), etc.

Memory circuitry 114 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively memory circuitry 114 may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

What is claimed is:

1. A method of optimizing a magnetic resonance imaging (MRI) system, the method comprising:
    optimizing, by a synergized pulsing-imaging network (SPIN) circuitry, a pulse sequence based, at least in part, on a loss function associated with a reconstruction network; and
    optimizing, by the SPIN circuitry, the reconstruction network based, at least in part, on intermediate raw MRI data and based, at least in part, on a ground truth MRI image data, the intermediate raw MRI data determined based, at least in part, on the pulse sequence.

2. The method of claim 1, further comprising
    determining, by the SPIN circuitry, an intermediate loss function based, at least in part, on the ground truth MRI image data and based, at least in part, on an optimized MRI image data output from the reconstruction network.

3. The method of claim 1, wherein the optimizing the pulse sequence comprises iteratively adjusting at least one pulse sequence parameter.

4. The method of claim 3, wherein the at least one pulse sequence parameter is selected from the group comprising a flip angle ($\alpha$), a first magnetic field gradient ($G_x$), a second magnetic field gradient ($G_y$) and a proton density ($\rho$).

5. The method of claim 3, wherein the at least one pulse sequence parameter is adjusted based, at least in part, on a loss gradient and based, at least in part, on a learning rate.

6. The method of claim 1, wherein the optimizing the pulse sequence and the optimizing the reconstruction network are iterative.

7. The method of claim 1, wherein the optimizing comprises determining whether a current intermediate loss function is within a maximum loss increment of a prior loss function.

8. The method of claim 1, wherein the pulse sequence is selected from the group comprising a spin-echo (SE) pulse sequence, a gradient-echo (GE) pulse sequence, an echo planar imaging (EPI) pulse sequence and an MR fingerprint (MRF) pulse sequence.

9. The method of claim 1, wherein the reconstruction network is an artificial neural network (ANN) selected from the group comprising a deep neural network, a convolutional neural network (CNN), a residual encoder-decoder CNN (RED-CNN), a generative adversarial network (GAN) and/or a multilayer perceptron.

10. A magnetic resonance imaging (MRI) system comprising:
   a synergized pulsing-imaging network (SPIN) circuitry configured to optimize a pulse sequence based, at least in part, on a loss function associated with a reconstruction network,
   the SPIN circuitry further configured to optimize the reconstruction network based, at least in part, on intermediate raw MRI data and based, at least in part, on a ground truth MRI image data, the intermediate raw MRI data determined based, at least in part, on the pulse sequence.

11. The system of claim 10, wherein the SPIN circuitry is configured to determine an intermediate loss function based, at least in part, on the ground truth MRI image data and based, at least in part, on an optimized MM image data output from the reconstruction network.

12. The system of claim 10, wherein the optimizing the pulse sequence comprises iteratively adjusting at least one pulse sequence parameter.

13. The system of claim 12, wherein the pulse sequence parameter is selected from the group comprising a flip angle ($\alpha$), a first magnetic field gradient ($G_x$), a second magnetic field gradient ($G_y$) and a proton density ($\rho$).

14. The system of claim 12, wherein the at least one pulse sequence parameter is adjusted based, at least in part, on a loss gradient and based, at least in part, on a learning rate.

15. The system according to claim 10, wherein the optimizing the pulse sequence and the optimizing the reconstruction network are iterative.

16. The system according to claim 10, wherein the optimizing comprises determining whether a current intermediate loss function is within a maximum loss increment of a prior loss function.

17. The system according to claim 10, wherein the pulse sequence is selected from the group comprising a spin-echo (SE) pulse sequence, a gradient-echo (GE) pulse sequence, an echo planar imaging (EPI) pulse sequence and an MR fingerprint (MRF) pulse sequence.

18. The system according to claim 10, wherein the reconstruction network is an artificial neural network (ANN) selected from the group comprising a deep neural network, a convolutional neural network (CNN), a residual encoder-decoder CNN (RED-CNN), a generative adversarial network (GAN) and/or a multilayer perceptron.

19. A device comprising means for performing the method according to claim 1.

20. A computer readable storage device having stored thereon instructions that when executed by one or more processors result in the following operations comprising the method according to claim 1.

* * * * *